(12) United States Patent
Bristol et al.

(10) Patent No.: US 10,796,909 B2
(45) Date of Patent: Oct. 6, 2020

(54) SURFACE-ALIGNED LITHOGRAPHIC PATTERNING APPROACHES FOR BACK END OF LINE (BEOL) INTERCONNECT FABRICATION

(71) Applicant: Intel Corporation, Santa Clara, CA (US)

(72) Inventors: Robert L. Bristol, Portland, OR (US); Kevin L. Lin, Beaverton, OR (US); James M. Blackwell, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/343,385

(22) PCT Filed: Dec. 2, 2016

(86) PCT No.: PCT/US2016/064684
§ 371 (c)(1),
(2) Date: Apr. 18, 2019

(87) PCT Pub. No.: WO2018/101961
PCT Pub. Date: Jun. 7, 2018

(65) Prior Publication Data
US 2019/0244806 A1 Aug. 8, 2019

(51) Int. Cl.
*H01L 21/027* (2006.01)
*H01L 21/033* (2006.01)
*H01L 21/768* (2006.01)

(52) U.S. Cl.
CPC ........ *H01L 21/0274* (2013.01); *H01L 21/027* (2013.01); *H01L 21/0337* (2013.01);
(Continued)

(58) Field of Classification Search
CPC combination set(s) only.
See application file for complete search history.

(56) References Cited

U.S. PATENT DOCUMENTS

| 6,228,763 | B1 | 5/2001 | Lee | |
|---|---|---|---|---|
| 9,041,217 | B1* | 5/2015 | Bristol | ................. H01L 23/528 257/774 |

(Continued)

OTHER PUBLICATIONS

International Search Report and Written Opinion for International Patent Application No. PCT/US2016/064684 dated, Aug. 30, 2017, 10 pgs.

*Primary Examiner* — Ratisha Mehta
(74) *Attorney, Agent, or Firm* — Schwabe, Williamson & Wyatt P.C.

(57) ABSTRACT

Surface-aligned lithographic patterning approaches for back end of line (BEOL) interconnect fabrication, and the resulting structures, are described. In an example, an integrated circuit structure includes a substrate. A plurality of alternating first and second conductive lines is along a first direction of a back end of line (BEOL) metallization layer in a first inter-layer dielectric (ILD) layer above the substrate. A conductive via is on and electrically coupled to one of the conductive lines of the plurality of alternating first and second conductive lines, the conductive via centered over the one of the conductive lines. A second ILD layer is above plurality of alternating first and second conductive lines and laterally adjacent to the conductive via. The second ILD layer has an uppermost surface substantially co-planar with the flat top surface of the conductive via.

25 Claims, 11 Drawing Sheets

(52) U.S. Cl.
CPC .. *H01L 21/76801* (2013.01); *H01L 21/76816* (2013.01); *H01L 21/76829* (2013.01); *H01L 21/76849* (2013.01); *H01L 21/76897* (2013.01)

(56) References Cited

U.S. PATENT DOCUMENTS

| | | |
|---|---|---|
| 2015/0255284 A1 | 9/2015 | Bristol et al. |
| 2016/0049584 A1* | 2/2016 | Dang ............... H01L 45/147 257/4 |
| 2016/0148869 A1 | 5/2016 | Schenker et al. |
| 2016/0163640 A1 | 6/2016 | Edelstein et al. |
| 2016/0179009 A1 | 6/2016 | Eilmsteiner et al. |

\* cited by examiner

SURFACE-ALIGNED LITHOGRAPHIC PATTERNING APPROACHES FOR BACK END OF LINE (BEOL) INTERCONNECT FABRICATION

CROSS-REFERENCE TO RELATED APPLICATION

This patent application is a U.S. National Phase Application under 35 U.S.C. § 371 of International Application No. PCT/US2016/064684, filed Dec. 2, 2016, entitled "SURFACE-ALIGNED LITHOGRAPHIC PATTERNING APPROACHES FOR BACK END OF LINE (BEOL) INTERCONNECT FABRICATION," which designates the United States of America, the entire disclosure of which is hereby incorporated by reference in its entirety and for all purposes.

TECHNICAL FIELD

Embodiments of the invention are in the field of semiconductor structures and processing and, in particular, surface-aligned lithographic patterning approaches for back end of line (BEOL) interconnect fabrication, and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be modeled sufficiently accurately, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners. The above factors are also relevant for considering placement and scaling of dielectric plugs or metal line ends among the metal lines of back end of line (BEOL) metal interconnect structures.

Thus, improvements are needed in the area of back end metallization manufacturing technologies for fabricating metal lines, metal vias, and dielectric plugs.

DESCRIPTION OF THE EMBODIMENTS

Figure 1A:
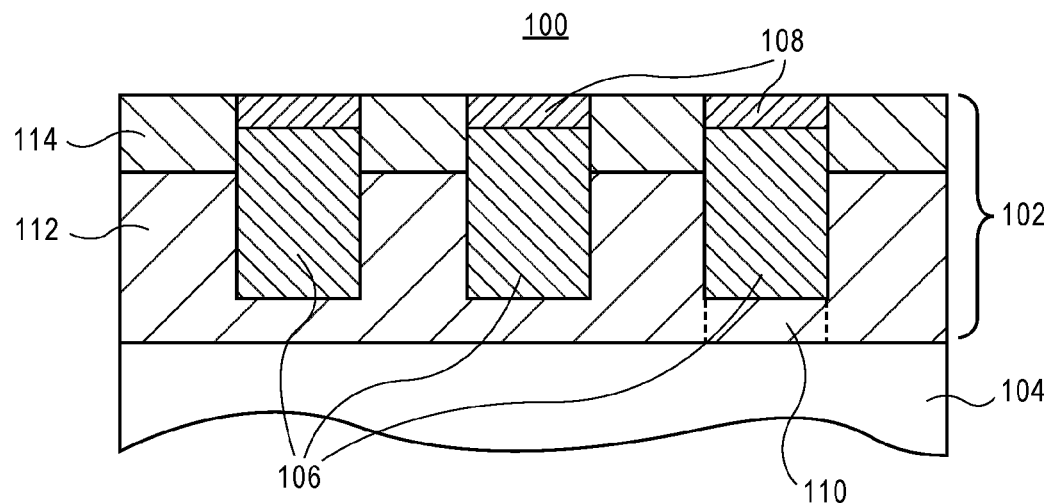
FIGS. 1A-1D illustrate cross-sectional views of portions of integrated circuit layers representing various operations in a method involving surface-aligned lithographic patterning for back end of line (BEOL) interconnect fabrication, in accordance with an embodiment of the present invention.

Surface-aligned lithographic patterning approaches for back end of line (BEOL) interconnect fabrication, and the resulting structures, are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to methods of using surface alignment to enable the fabrication of self-aligned interconnects. To provide context, current solutions to improve shorting margin may include: (1) using metal recess to fill alternate metal trenches with different hard masks, (2) using different "color" metal caps to as a template for directed self-assembly (DSA) or selective growth, or (3) recessing the metal or ILD to "steer" the via towards the line of interest. Embodiments may be implemented to provide improved via shorting margin by self-alignment based on surface-aligned lithographic patterning, e.g., for the 10 nm and smaller technology nodes. Particular embodiments may include self-aligning a lithographic pattern to direct surface patterns below a resist layer. Such approaches may be applied to any interconnect metal layer and, possibly, to gate contacts.

Embodiments may provide advantages when implemented, such as addressing issues associated with conventional lithography which generally involves patterning features well above a substrate of interest and are only directly aligned to an underlying layer of interest using an optical lithography system of a scanner. In accordance with an embodiment of the present invention, a layer of interest is modified in such a way that when resist is exposed directly above the surface of the layer, the features are encouraged to appear in a self-aligned manner directly above the patterns in the layer. Embodiments may be implemented using one of several approaches, such as (1) performing a single-pass process, (2) performing a two-pass process (e.g., fracturing a lithographic pattern into two sub-patterns, or (3) a combination of (1) and (2) with a single-layer via process.

In a first exemplary approach, a single-pass process flow is described involving selectively grafting a resist component (e.g., a quencher) onto regions between metal lines. For example, FIGS. 1A-1D illustrate cross-sectional views of portions of integrated circuit layers representing various operations in a method involving surface-aligned lithographic patterning for back end of line (BEOL) interconnect fabrication, in accordance with an embodiment of the present invention.

Referring to FIG. 1A, a starting point structure 100 is provided as a beginning point for fabricating a new metallization layer above an underlying metallization layer 102. The underlying metallization layer 102 includes an interlayer dielectric (ILD) layer 112, which has an upper surface portion 114 thereon. The upper surface portion 114 can be a same material as the ILD layer 112 and therefore represents an upper portion of the ILD layer 112. In another embodiment, the upper surface portion is a distinct dielectric layer such as a dielectric hardmask layer. As described below, the ILD layer may be disposed above a substrate 104 and, in one embodiment, is disposed over an underlying metallization layer.

The metallization layer 102 further includes a plurality of conductive lines 106 formed in the upper surface layer 114 and the ILD layer 112. In an embodiment, the plurality of conductive lines 106 is a plurality of same conductive line types. In another embodiment, the plurality of conductive lines 106 is a plurality of alternating first and second different types of conductive lines. In one embodiment, each of the plurality of conductive lines 106 includes a conductive cap layer 108, as is depicted. One or more of the plurality of conductive lines 106 can be coupled to an underlying via, and exemplary location for which is shown as 110 in FIG. 1A. In other embodiments, the cap layer is non-conductive, and a break though operation may be performed with unwanted via locations protected by the cap layer.

In an embodiment, in the case that the plurality of conductive lines 106 is a plurality of alternating first and second different types of conductive lines, the starting structure 100 is fabricated by patterning a hardmask and ILD layer and then metallizing half of the population of metal trenches (e.g., alternating one of the trenches), leaving the other half of the population open, and then subsequently filling the remaining open trenches. In an embodiment, whether same lines or alternating different lines, trenches in the ILD for conductive line formation are patterned using a pitch division patterning process flow. Non-limiting examples of such pitch division schemes are described in greater detail below in association with FIGS. 6A, 6B and 7. It is to be appreciated that the following process operation described below may first involve pitch division, or may not. In either case, but particularly when pitch division is also used, embodiments may enable continued scaling of the pitch of metal layers beyond the resolution capability of state-of-the art lithography equipment.

Figure 1B:
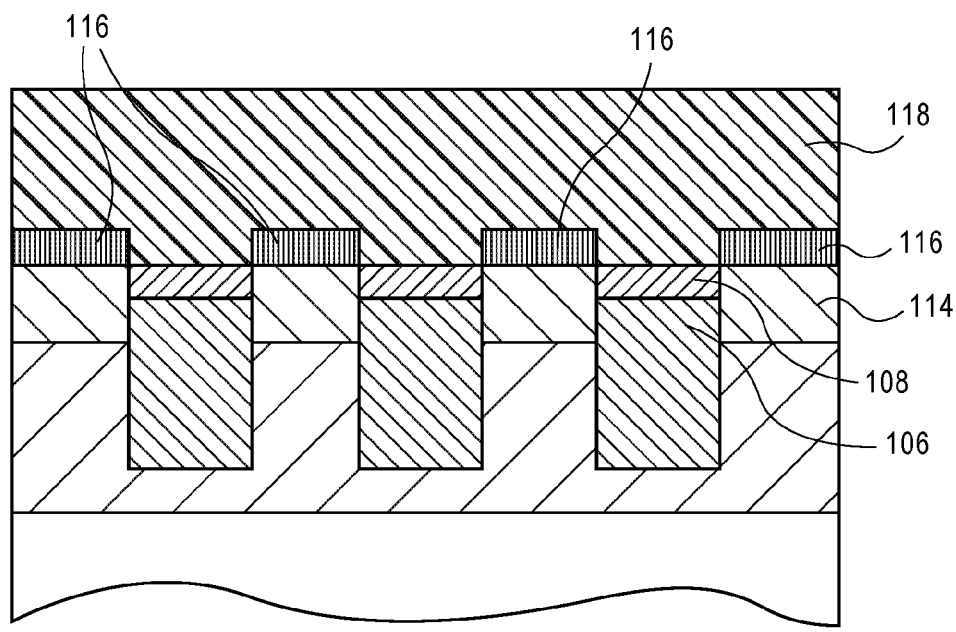

Referring to FIG. 1B, a surface quencher layer 116 is formed on the exposed surfaces of the upper surface portion 114 of the ILD layer 112 of the metallization layer 102, but is not formed on exposed surfaces of the plurality of conductive lines 106. In one embodiment, the surface quencher layer 116 is selectively grafted onto the upper surface portion 114 of the ILD layer 112 of the metallization layer 102. In another embodiment, the surface quencher layer 116 is selectively grown onto the upper surface portion 114 of the ILD layer 112 of the metallization layer 102. In a particular embodiment, the conductive capping layer 108 of the plurality of conductive lines inhibits formation of the surface quencher layer 116 on the plurality of conductive lines 102. In any case, a resist layer 118 is then formed over the surface quencher layer 116 and over the plurality of conductive lines 106.

In an embodiment, resist layer 118 is formed using a spin-on process. In an embodiment, resist layer 118 has a photolyzable composition. In one such embodiment, the photolyzable composition includes an acid-deprotectable photoresist material. In an embodiment, a photo-acid generator (PAG) component is included and, in a specific embodiment, includes a material selected from the group consisting of triethyl, trimethyl and other trialkylsulfonates, where the sulfonate group is selected from the group consisting of trifluoromethylsulfonate, nonanfluorobutanesulfonate, and p-tolylsulfonate, or other examples containing —SO$_3$ sulfonate anion bound to organic group. In an embodiment, the acid-deprotectable photoresist material is an acid-deprotectable material selected from the group consisting of a polymer, a molecular glass, a carbosilane and a metal oxide. In an embodiment, the acid-deprotectable photoresist material includes a material selected from the group consisting of a polyhydroxystyrene, a polymethacrylate, small molecular weight molecular glass versions of a polyhydroxystyrene or a polymethacrylate which contain ester functionality sensitive to acid-catalyzed deprotection to carboxylic acid, a carbosilane, and a metal oxide possessing functionality sensitive to acid catalyzed deprotection or cross-linking. In an embodiment, the photolyzable material is a negative tone material, as depicted herein. However, in other embodiments, the photolyzable material is not a photo-acid generator (PAG)-based photolyzable material and/or the photolyzable material is a positive tone material.

In an embodiment, surface quencher 116 includes molecules that can be used to target SiOH-containing surfaces selectively versus metal, metal oxide or metal nitride surfaces. In one such embodiment, the surface quencher 116 includes an alkoxysilane or an aminosilane. Examples that further deliver a quenching molecule or a base include 3-aminiopropyldimethyldimethylaminosilane, 3-aminopropyltriethoxysilane, or 2-pyridylethyltriethoxysilane. In an embodiment, the surface quencher 116 is a base or includes a basic component to counter a generated acid in an exposed photoresist material based on a PAG. The surface quencher 116 may be a grafted layer, and is referred to as a quencher in that the surface quencher 116 effectively quenches the effect of any exposure to photoresist in locations that are not targeted for exposure, as is described below.

Figure 1C:
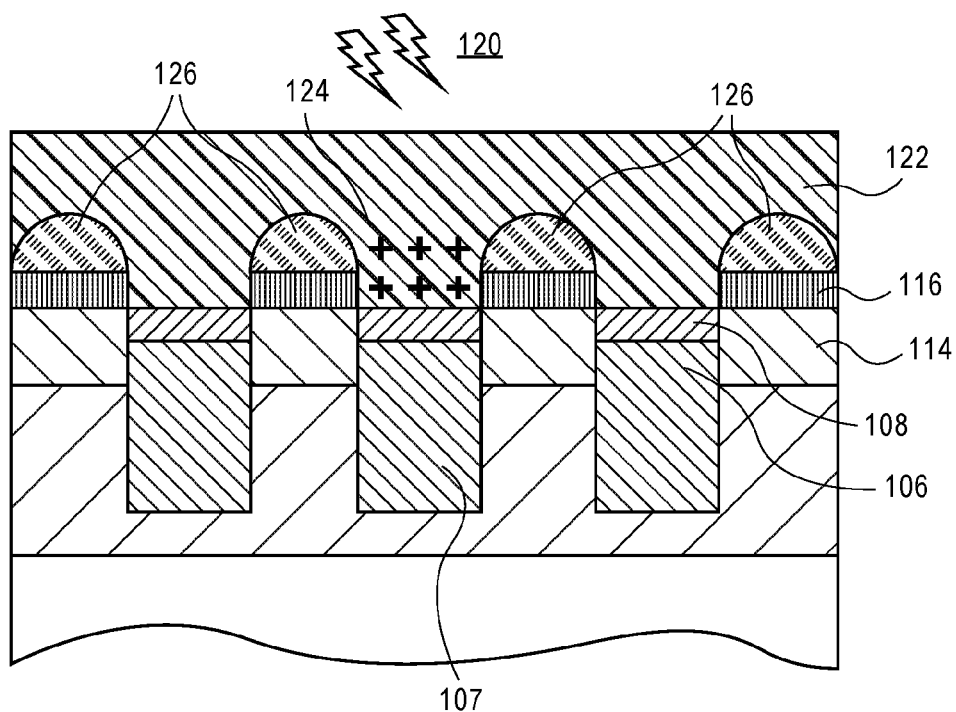

Referring to FIG. 1C, a lithographic exposure 120 of portions 124 of the resist layer 118 over a select conductive line 107 of the plurality of conductive lines 106 is performed to form an exposed resist layer 122. The surface quencher layer 116 creates a sensitivity modulated region (also referred to as a slow zone) 126 in the resist layer 118/122 adjacent to the select conductive line 107. For example, in one embodiment, acids of the resist layer 118/122 are quenched in sensitivity modulated region 126. In an embodiment, the resist layer 118/122 is a negative tone resist layer in that exposed portions of the resist layer 118/122 are retained after development. It is to be appreciated that concepts described herein may also be implemented for a positive tone resist.

In accordance with an embodiment of the present invention, the forming of the sensitivity modulated region 126 accommodates for misalignment in a lithographic process, such that non-selected lines adjacent to the selected line 107 are not "exposed" during the lithographic exposure 120. In another embodiment, the forming of the sensitivity modulated region 126 accommodates for the use of a relatively wider exposure window in a lithographic process, such that non-selected lines adjacent to the selected line 107 are not exposed during the lithographic exposure 120. In yet another embodiment, the forming of the sensitivity modulated region 126 accommodates for both misalignment in a lithographic process and for the use of a relatively wider exposure window in a lithographic process, such that non-selected lines adjacent to the selected line 107 are not exposed during the lithographic exposure 120. Overall, even though portions of the resist layer 118/122 over conductive lines 106 adjacent to the select conductive line 107 may be exposed, they are not selected upon eventual development due to the inhibiting effect of the surface quencher layer 116 on the resist layer 118.

In an embodiment, the lithographic exposure 120 involves exposing the structure to extreme ultraviolet (EUV) or e-beam radiation. In an embodiment, the EUV or e-beam radiation has a wavelength approximately 13.5 nanometers. In another embodiment, exposing the structure to extreme ultraviolet (EUV) or e-beam radiation includes exposing the structure to energy in the range of 5-150 keV. In an embodiment, exposing the structure to UV radiation includes exposing the structure to energy having a wavelength approximately 365 nanometers. In an embodiment, exposing the structure to UV radiation includes exposing the structure to energy having a wavelength approximately 193 nanometers. In an embodiment, subsequent to the lithographic exposure 120, a bake operation is performed. In one such embodiment, the bake is performed at a temperature approximately in the range of 50-120 degrees Celsius for a duration of approximately in the range of 0.5-5 minutes.

Figure 1D:
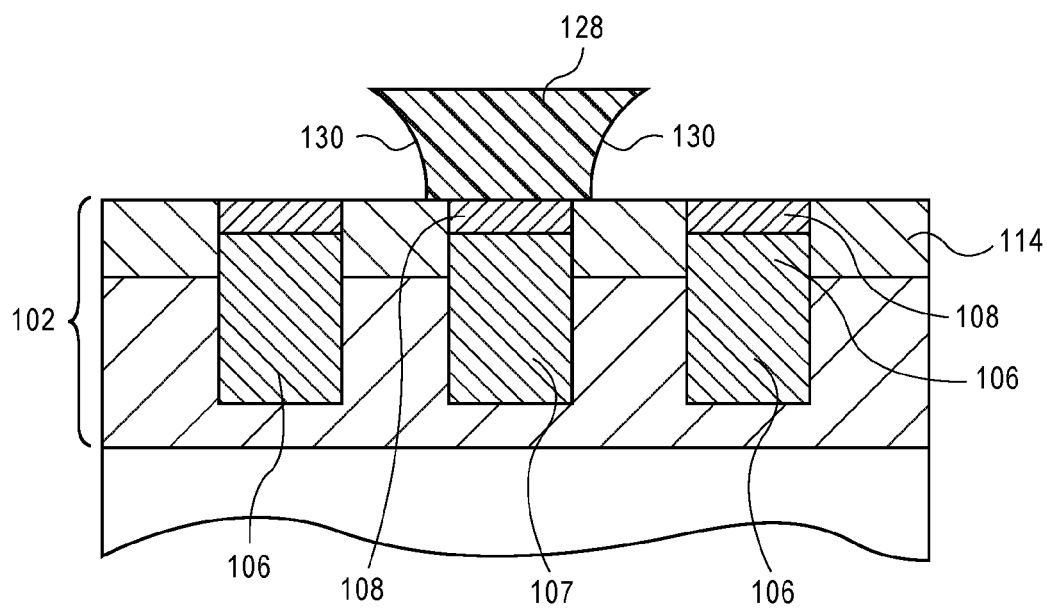

Referring to FIG. 1D, the exposed resist layer 122 is developed to remove portions of the resist layer not exposed to the lithographic exposure 120 and to remove the sensitivity modulated region 126. The exposed portion 124, not including any portions of resist layer exposed in the sensitivity modulated region 126, is retained as a resist feature 128 over the select conductive line 107. In an embodiment, the resist feature 128 has reentrant sidewalls 130 which are essentially conformal with the regions of the sensitivity modulated region 126, now removed. In one such embodiment, the reentrant sidewalls 130 are inwardly curved, as is depicted.

In an embodiment, in the case of negative tone development, developing includes immersion or coating with organic solvents such as cyclohexanone, 2-heptanone, propylene glycol methylethyl acetate or others followed by rinse with another organic solvent such as hexane, heptane, cyclohexane or the like. In another embodiment, in the case of positive tone development, developing includes immersion or coating with standard aqueous TMAH developer (e.g., in a concentration range from 0.1M-1M) or other aqueous or alcoholic developer based on tetraalkylammonium hydroxides for 30-120 seconds followed by rinse with deionized (DI) water.

In a second exemplary approach, another single-pass process flow is described involving selectively grafting a resist component (e.g., a quencher) onto metal lines neighboring a selected metal line, where the metal lines are alternating lines of different type and/or structure. For example, FIGS. 2A-2C illustrate cross-sectional views of portions of integrated circuit layers representing various operations in another method involving surface-aligned lithographic patterning for back end of line (BEOL) interconnect fabrication, in accordance with another embodiment of the present invention.

Figure 2A:
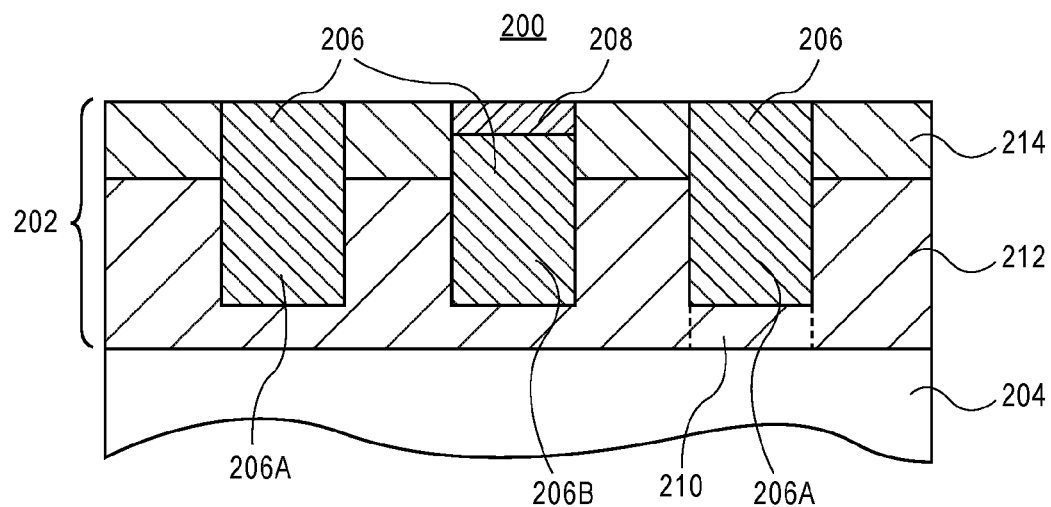
FIGS. 2A-2C illustrate cross-sectional views of portions of integrated circuit layers representing various operations in another method involving surface-aligned lithographic patterning for back end of line (BEOL) interconnect fabrication, in accordance with another embodiment of the present invention.
Figure 2B:
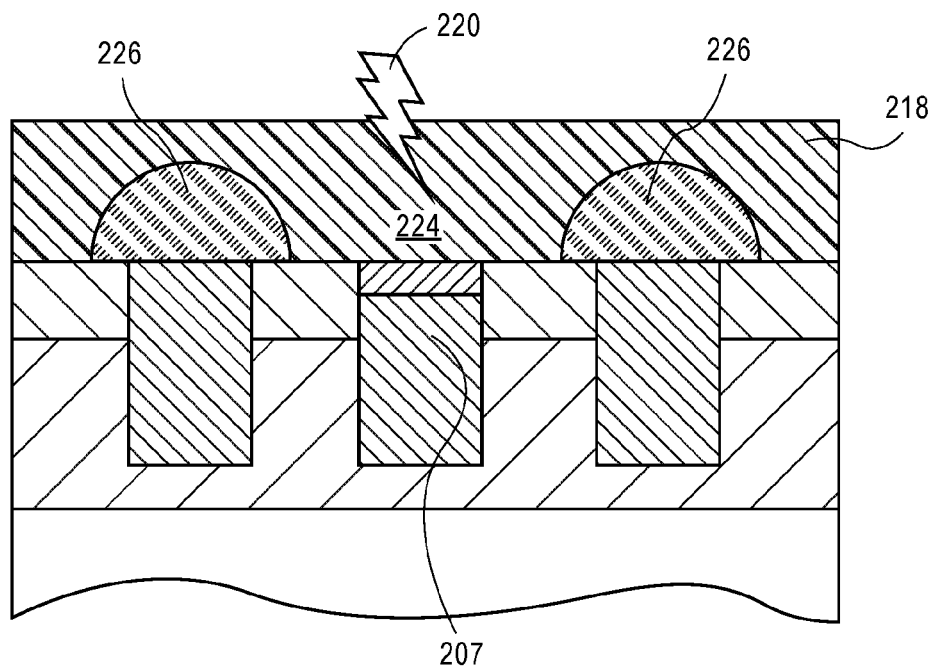
Figure 2C:
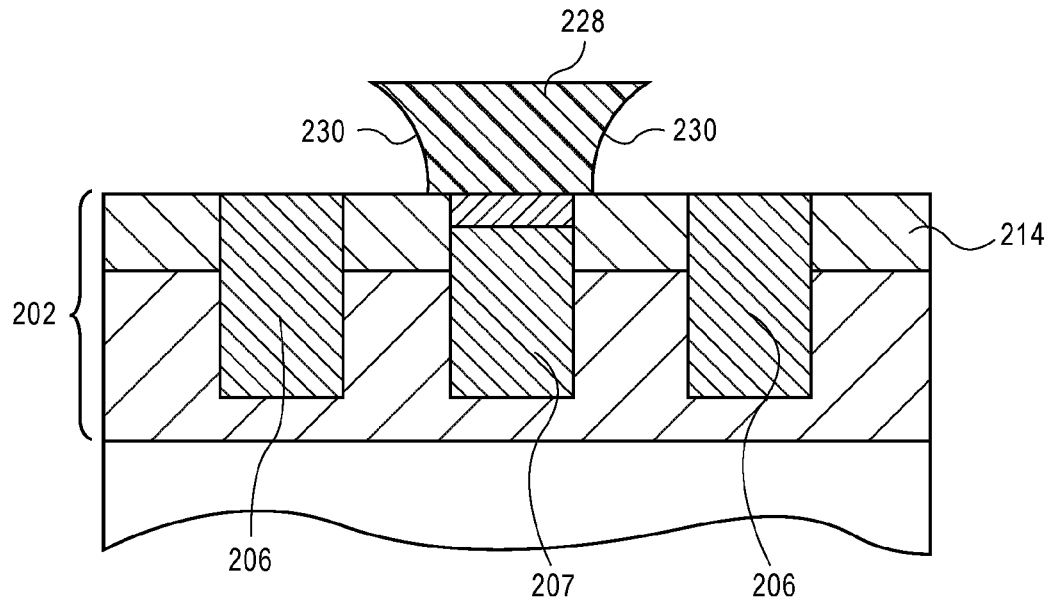

Referring to FIG. 2A, a starting point structure 200 is provided as a beginning point for fabricating a new metallization layer above an underlying metallization layer 202. The underlying metallization layer 202 includes an inter-layer dielectric (ILD) layer 212, which has an upper surface portion 214 thereon. The upper surface portion 214 can be a same material as the ILD layer 212 and therefore represents an upper portion of the ILD layer 212. In another embodiment, the upper surface portion is a distinct dielectric layer such as a dielectric hardmask layer. As described below, the ILD layer may be disposed above a substrate 204 and, in one embodiment, is disposed over an underlying metallization layer.

The metallization layer 202 further includes a plurality of conductive lines 206 formed in the upper surface layer 214 and the ILD layer 212. In an embodiment, the plurality of conductive lines 206 is a plurality of alternating first 206A and second 206B different types of conductive lines. One or more of the plurality of conductive lines 206 can be coupled to an underlying via, and exemplary location for which is shown as 210 in FIG. 2A.

In an embodiment, the plurality of alternating first 206A and second 206B different types of conductive lines includes conductive interconnects of alternating, differing first and second compositions. In another embodiment, however, the metal lines are fabricated from substantially the same material. In an embodiment, the lines 206A do not include a conductive cap 208, while the lines 206B include a conductive cap 208. In an embodiment, the first metal lines 206A are spaced apart by a pitch, and the second metal lines 206B are spaced apart by the same pitch. In other embodiments, the lines are not necessarily spaced by a pitch. Additionally, there may be cases where some lines have different critical dimensions (CDs) than others.

In an embodiment, the plurality of conductive lines 206 including alternating first 206A and second 206B different types of conductive lines is fabricated by patterning a hardmask and ILD layer and then metallizing half of the population of metal trenches (e.g., alternating one of the trenches), leaving the other half of the population open, and then subsequently filling the remaining open trenches. In an embodiment, trenches in the ILD for conductive line formation are patterned using a pitch division patterning process flow. Non-limiting examples of such pitch division schemes are described in greater detail below in association with FIGS. 6A, 6B and 7. It is to be appreciated that the following process operation described below may first involve pitch division, or may not. In either case, but particularly when pitch division is also used, embodiments may enable continued scaling of the pitch of metal layers beyond the resolution capability of state-of-the art lithography equipment.

Referring to FIG. 2B, a surface quencher layer, such as surface quencher layer 116, is formed on the exposed surfaces of the conductive lines 206A, but is not formed on exposed surfaces of the conductive line 206B. In a particular embodiment, the conductive capping layer 208 of the conductive lines 206B inhibits formation of the surface quencher layer thereon, and the surface quencher layer is confined to the surfaces of conductive lines that do not include a conductive cap 208. A resist layer 218, such as a resist layer described in association with resist layer 118, is then formed over the surface quencher layer and over both types 206A and 206B of lines the plurality of conductive lines 206. A lithographic exposure 220 of portions 224 of the resist layer 218 over a select conductive line 207 of the plurality of conductive lines 206 is performed to form an exposed resist layer.

Referring again to FIG. 2B, the surface quencher layer over the conductive lines 206A creates a sensitivity modulated region 226 in the resist layer 218 adjacent to the select conductive line 207. For example, in one embodiment, acids of the resist layer 218 are quenched in sensitivity modulated region 226. In one such embodiment, the quenching is due to an included surface quencher layer. In an alternative embodiment, a surface quencher layer is omitted and the quenching is driven by a surface chemistry of lines 206A different from line 206B. It is to be appreciated that sensitivity modulated regions 226 are aligned with conductive lines 206A, whereas sensitivity modulated regions 126 described above are aligned with ILD surfaces between a plurality of conductive lines. In an embodiment, the resist layer 218 is a negative tone resist layer in that exposed portions of the resist layer 218 are retained after development. It is to be appreciated that concepts described herein may also be implemented for a positive tone resist.

Referring to FIG. 2C, the exposed resist layer is developed to remove portions of the resist layer not exposed to the lithographic exposure 220 and to remove the sensitivity modulated region 226. The exposed portion 224, not including any portions of resist layer exposed in the sensitivity modulated region 226, is retained as a resist feature 228 over the select conductive line 207. In an embodiment, the resist feature 228 has reentrant sidewalls 230 which are essentially conformal with the regions of the sensitivity modulated region 226, now removed. In one such embodiment, the reentrant sidewalls 230 are inwardly curved, as is depicted.

Referring to both schemes of FIGS. 1A-1D and 2A-2C, in accordance with an embodiment of the present invention, a method of fabricating a back end of line (BEOL) metallization layer includes forming a plurality of conductive lines along a first direction of a back end of line (BEOL) metallization layer in a first inter-layer dielectric (ILD) layer above a substrate. A surface quencher layer is formed on upper surfaces of the ILD layer between adjacent ones of the plurality of conductive lines, or is formed on conductive lines neighboring a selected one of the plurality of conductive lines. A resist layer is formed on the plurality of conductive lines and on the surface quencher layer. A lithographic exposure of a portion of the resist layer above the one of the plurality of conductive lines is performed, where the surface quencher layer creates a sensitivity modulated region in the resist layer adjacent to the portion of the resist layer. The resist layer is developed to remove portions of the resist layer not exposed to the lithographic exposure, to remove the sensitivity modulated region, and to retain the portion of the resist layer.

In a third exemplary approach, a process flow is described involving selectively grafting a resist component (e.g., a quencher) onto a selected metal line. As an example, FIGS. 3A and 3B illustrate cross-sectional views of portions of integrated circuit layers representing various operations in another method involving surface-aligned lithographic patterning for back end of line (BEOL) interconnect fabrication, in accordance with another embodiment of the present invention.

Figure 3A:
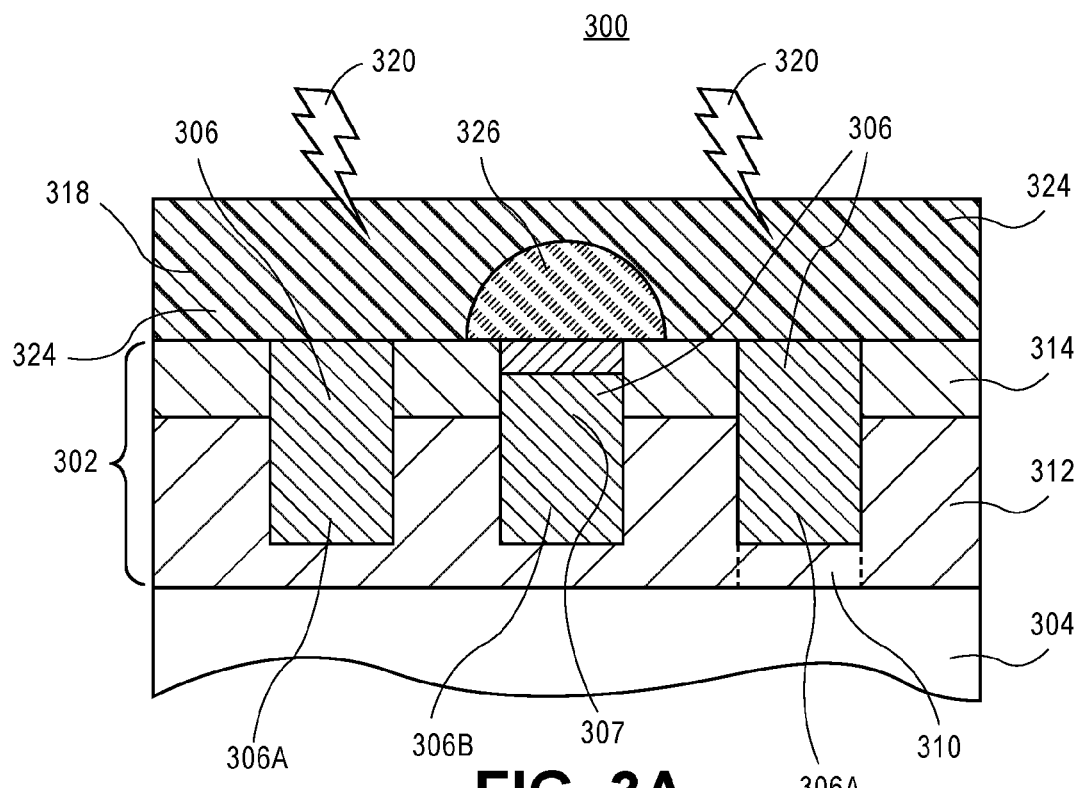
FIGS. 3A and 3B illustrate cross-sectional views of portions of integrated circuit layers representing various operations in another method involving surface-aligned lithographic patterning for back end of line (BEOL) interconnect fabrication, in accordance with another embodiment of the present invention.
Figure 3B:
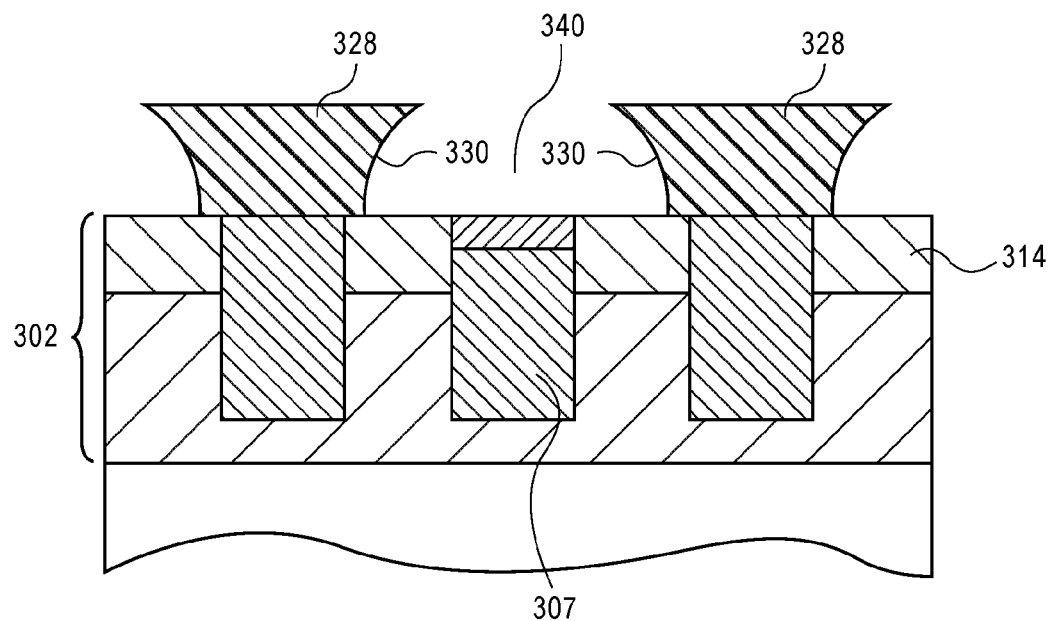

Referring to FIG. 3A, a starting point structure 300 is provided as a beginning point for fabricating a new metallization layer above an underlying metallization layer 302. The underlying metallization layer 302 includes an interlayer dielectric (ILD) layer 312, which has an upper surface portion 314 thereon. The upper surface portion 314 can be a same material as the ILD layer 312 and therefore represents an upper portion of the ILD layer 312. In another embodiment, the upper surface portion is a distinct dielectric layer such as a dielectric hardmask layer. As described below, the ILD layer may be disposed above a substrate 304 and, in one embodiment, is disposed over an underlying metallization layer.

The metallization layer 302 further includes a plurality of conductive lines 306 formed in the upper surface layer 314 and the ILD layer 312. In an embodiment, the plurality of conductive lines 306 is a plurality of alternating first 306A and second 306B different types of conductive lines. One or more of the plurality of conductive lines 306 can be coupled to an underlying via, and exemplary location for which is shown as 310 in FIG. 3A.

In an embodiment, the plurality of alternating first 306A and second 306B different types of conductive lines includes conductive interconnects of alternating, differing first and second compositions. In another embodiment, however, the metal lines are fabricated from substantially the same material. In an embodiment, the lines 306A do not include a conductive cap 308, while the lines 306B include a conductive cap 308. In an embodiment, the first metal lines 306A are spaced apart by a pitch, and the second metal lines 306B are spaced apart by the same pitch. In other embodiments, the lines are not necessarily spaced by a pitch.

Referring again to FIG. 3A, a surface quencher layer, such as surface quencher layer 116, is formed on the exposed surfaces of the conductive lines 306B, but is not formed on exposed surfaces of the conductive line 306A. In a particular embodiment, the conductive capping layer 308 of the conductive lines 306B directs formation of the surface quencher layer thereon, and the surface quencher layer is confined to the surfaces of conductive lines that include a conductive cap 308. A resist layer 318, such as a resist layer described in association with resist layer 118, is then formed over the surface quencher layer and over both types 306A and 306B of lines the plurality of conductive lines 306. A lithographic exposure 320 of portions 324 of the resist layer 318 over lines neighboring a select conductive line 307 of the plurality of conductive lines 306 is performed to form an exposed resist layer 324.

Referring again to FIG. 3A, the surface quencher layer over the conductive lines 206B (i.e., over select line 307) creates a sensitivity modulated region 326 in the resist layer 318 over the select conductive line 307. For example, in one embodiment, acids of the resist layer 318 are quenched in sensitivity modulated region 326. In one such embodiment, the quenching is due to an included surface quencher layer. In an alternative embodiment, a surface quencher layer is omitted and the quenching is driven by a surface chemistry of line 306B (and, if included, conductive capping layer 308) different from lines 306A. It is to be appreciated that sensitivity modulated region 326 is aligned with conductive line 306B, whereas sensitivity modulated regions 126 described above are aligned with ILD surfaces between a plurality of conductive lines, and sensitivity modulated regions 226 described above are aligned with conductive lines 206A. In an embodiment, the resist layer 318 is a negative tone resist layer in that exposed portions of the resist layer 318 are retained after development. It is to be appreciated that concepts described herein may also be implemented for a positive tone resist. Referring to FIG. 3B, the exposed resist layer 324 is developed to remove portions of the resist layer not exposed to the lithographic exposure 320 and to remove the sensitivity modulated region 326. The exposed portions 324, not including any portions of resist layer exposed in the sensitivity modulated region 326, are retained as resist features 328 over conductive lines neighboring the select conductive line 307. In an embodiment, the resist features 328 each have reentrant sidewalls 330 which are essentially conformal with the regions of the sensitivity modulated region 326, now removed. In one such embodiment, the reentrant sidewalls 330 are inwardly curved, as is depicted. The features 328 are laterally adjacent to an opening 340 formed over target line 307.

Referring more generally to the process depicted in association with FIGS. 3A-3B, in accordance with an embodiment of the present invention, a method of fabricating a back end of line (BEOL) metallization layer includes forming a plurality of conductive lines along a first direction of a back end of line (BEOL) metallization layer in a first inter-layer dielectric (ILD) layer above a substrate. A surface quencher layer is formed on an upper surface of one of the plurality of conductive lines. A resist layer is formed on the plurality of conductive lines and on the surface quencher layer. A lithographic exposure of portions of the resist layer adjacent to the one of the plurality of conductive lines is performed, where the surface quencher layer creates a sensitivity modulated region in the resist layer above the one of the plurality of conductive lines. The resist layer is developed to remove portions of the resist layer not exposed to the lithographic exposure, to remove the sensitivity modulated region, and to retain the portions of the resist layer.

In an embodiment, a two-pass process flow may effectively combine the processes described in association with FIGS. 2A-2C and 3A-3B, e.g., the latter following the former, to ultimately provide conductive via locations on different lines in a metallization layer. For example, in one embodiment, a resist component (e.g., a quencher) is first grafted onto odds line for a first pass. A resist component is then grafted onto the even lines for a second pass. In one particular such embodiment, the patterned resist resulting from the first pass is frozen to withstand processing associated with the second pass.

As described in greater detail below, in an embodiment, the resulting structures of FIG. 1D, 2C or 3B enable improved via shorting margins when fabricating later via layers on the structures of FIG. 1D, 2C or 3B. In one embodiment, improved shorting margin is achieved since fabricating a structure using a surface-aligned lithographic patterning approach reduces the risk of a via shorting to the wrong metal line. In one embodiment, self-alignment is achieved since the via placement is based on the original surface-aligned lithographic patterning.

The resulting structures of FIG. 1D or 2C may be used to fabricate a conductive via structure in place of the resist features formed. As a general processing example, FIGS. 4A-4D illustrate cross-sectional views of portions of integrated circuit layers representing various operations in a method of forming a self-aligned conductive via, in accordance with another embodiment of the present invention.

Figure 4A:
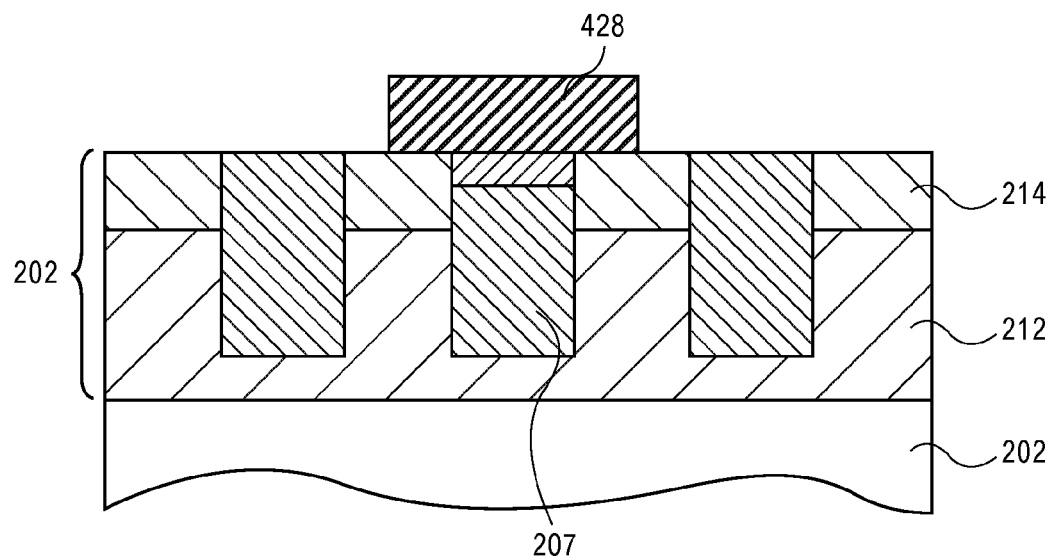
FIGS. 4A-4D illustrate cross-sectional views of portions of integrated circuit layers representing various operations in a method of forming a self-aligned conductive via, in accordance with another embodiment of the present invention.
Figure 4B:
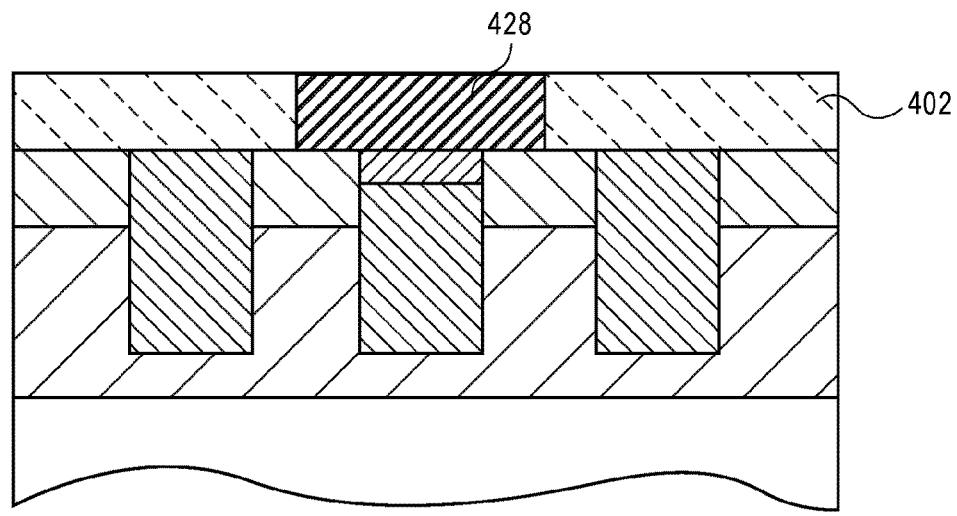
Figure 4C:
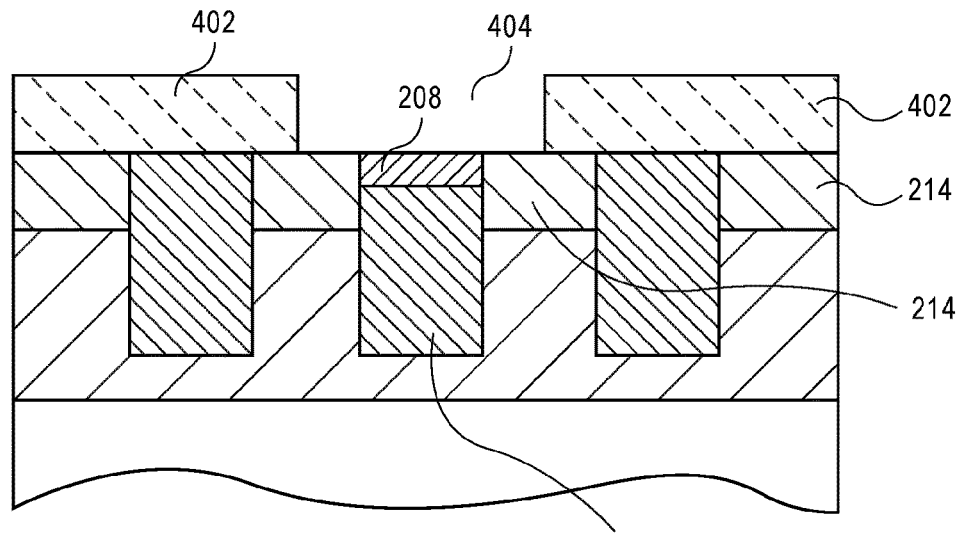
Figure 4D:
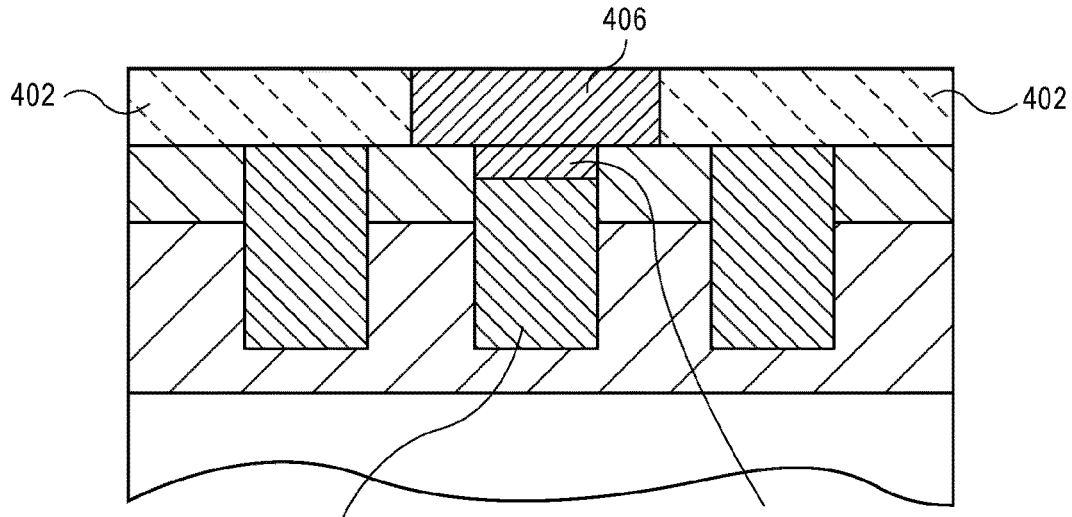

Referring to FIG. 4A, a resist feature 428 is shown generically over a select line 207 of a metallization layer 202. The resist feature may be a feature such as described in association with resist feature 228 of FIG. 2C. Referring to FIG. 4B, a second ILD layer 402 is formed above the plurality of conductive lines 206/207 and laterally adjacent to the resist feature 428. Referring to FIG. 4C, the resist feature 428 is removed to form an opening 404. Referring to FIG. 4D, a conductive via 406 is formed in the opening 404. As such, the conductive via 406 is formed in place of the resist feature 428. In an embodiment, the conductive via 406 is on and electrically coupled to the select one of the plurality of conductive lines 207.

In an embodiment, the second ILD layer 402 is formed using a relatively low temperature deposition process (e.g., below approximately 300 degrees Celsius), such as a spin-on and low temperature bake process, which may be followed by a planarization process. In an embodiment, the second ILD layer 402 includes a layer including a plurality of trisilacyclohexanes cross-linked together by O groups. For example, in one such embodiment, a linked trisilacyclohexane structure includes a complex mix of oligomers, but having in common H-capped trisilacyclohexane rings. In an embodiment, the conductive via 406 is formed by blanket depositing one or more conductive layers and then planarizing the one or more conductive layers. In another embodiment, the conductive via 406 is formed by selectively forming one or more conductive layers within the opening 404.

In another aspect, the resulting structure of FIG. 3B may be used to fabricate a conductive via structure in place of the opening formed between neighboring resist features. In an embodiment, the opening 340 is ultimately filled with a conductive via. In one such embodiment, the resist features 328 are ultimately replaced with a second ILD layer. In a particular such embodiment, the second ILD layer includes a plurality of trisilacyclohexanes cross-linked together by O groups.

More generally, one or more embodiments are directed to an approach for fabricating metal lines as well as the conductive vias and non-conductive spaces or interruptions between metals lines (referred to as "plugs"). Vias, by definition, are used to land on a previous layer metal pattern. In this vein, embodiments described herein enable a more robust interconnect fabrication scheme since constraints on lithography equipment is relaxed. Such an interconnect fabrication scheme can be used to save numerous alignment/exposures, and can be used to reduce total process operations and processing time otherwise required for patterning such features using conventional approaches. Other benefits may include improvements in yield, or the prevention of shorting to a wrong line. In an embodiment, every conductive via of the final structure is essentially perfectly self-aligned to the metal lines below.

As described above in association with FIGS. 1A-1D, 2A-2C, and 4A-4D, a conductive via structure is ultimately formed in a location previously occupied by a patterned resist feature on a conductive line. As a structural example of a metallization layer including such a conductive via, FIG. 5A illustrates a cross-sectional view of a portion of an integrated circuit layer including a self-aligned conductive via, in accordance with an embodiment of the present invention.

Figure 5A:
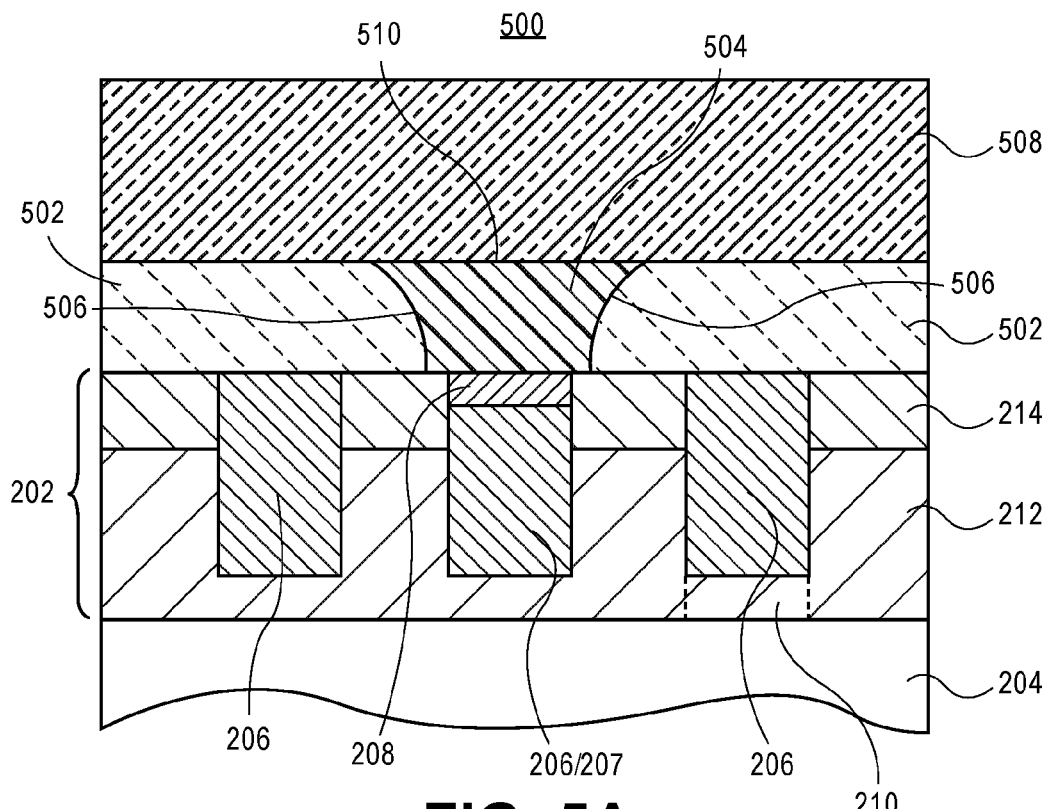
FIG. 5A illustrates a cross-sectional view of a portion of an integrated circuit layer including a self-aligned conductive via, in accordance with an embodiment of the present invention.

Referring to FIG. 5A, an integrated circuit structure 500 includes a substrate 204. A plurality of alternating first and second conductive lines 206 is along a first direction of a back end of line (BEOL) metallization layer 202 in a first inter-layer dielectric (ILD) layer 212 (and possibly 214) above the substrate 202. Although depicted as alternating differing lines, the lines could instead be lines of a same composition. A conductive via 504 is on and electrically coupled to one of the conductive lines 207 of the plurality of alternating first and second conductive lines 206. The conductive via 504 has a flat top surface 510 and reentrant sidewalls 506. That is, the conductive via 504 essentially matches the geometry of the resist features 128 or 228 described above. In one embodiment, the conductive via 504 is centered over the one of the conductive lines 207. A second ILD layer 502 is above the plurality of alternating first and second conductive lines 206 and laterally adjacent to the conductive via 504. In an embodiment, the second ILD layer 502 has an uppermost surface substantially co-planar with the flat top surface 510 of the conductive via 504, as is depicted in FIG. 5A. The flat top surface 510 may be formed during a planarization process, such as a chemical mechanical planarization (CMP) process, used to form the conductive via 504.

In an embodiment, the reentrant sidewalls 506 of the conductive via 504 are inwardly curved, as is depicted in FIG. 5A. In an embodiment, the integrated circuit structure 500 further includes an upper conductive line 508 on the second ILD layer 502 and on and electrically connected to the conductive via 504. In one such embodiment, the upper conductive line 508 is along a second direction orthogonal to the first direction. In an embodiment, the upper conductive line 508 includes a barrier layer on the entire flat surface 510 of the conductive via 504.

In an embodiment, the second ILD layer 502 includes a plurality of trisilacyclohexanes cross-linked together by O groups. In an embodiment, the first conductive lines are spaced apart by a pitch, and the second conductive lines are spaced apart by the pitch. In an embodiment, a total composition of the first conductive lines is the same as a total composition of the second conductive lines. In another embodiment, a total composition of the first conductive lines is different from a total composition of the second conductive lines. In an embodiment, each of the first conductive lines includes a conductive cap layer 208, and each of the second conductive lines does not include a conductive cap layer. In one such embodiment, the one of the conductive lines 207 of the plurality of alternating first and second conductive lines 206 is a first conductive line, and the conductive via 504 is on the conductive cap layer 208 of the one of the conductive lines 207.

As described above in association with FIGS. 3A-3B, a conductive via structure is ultimately formed in a location previously occupied by an opening between patterned resist features, the opening above on a conductive line. As a structural example of a metallization layer including such a conductive via, FIG. 5B illustrates a cross-sectional view of a portion of an integrated circuit layer including a self-aligned conductive via, in accordance with another embodiment of the present invention.

Figure 5B:
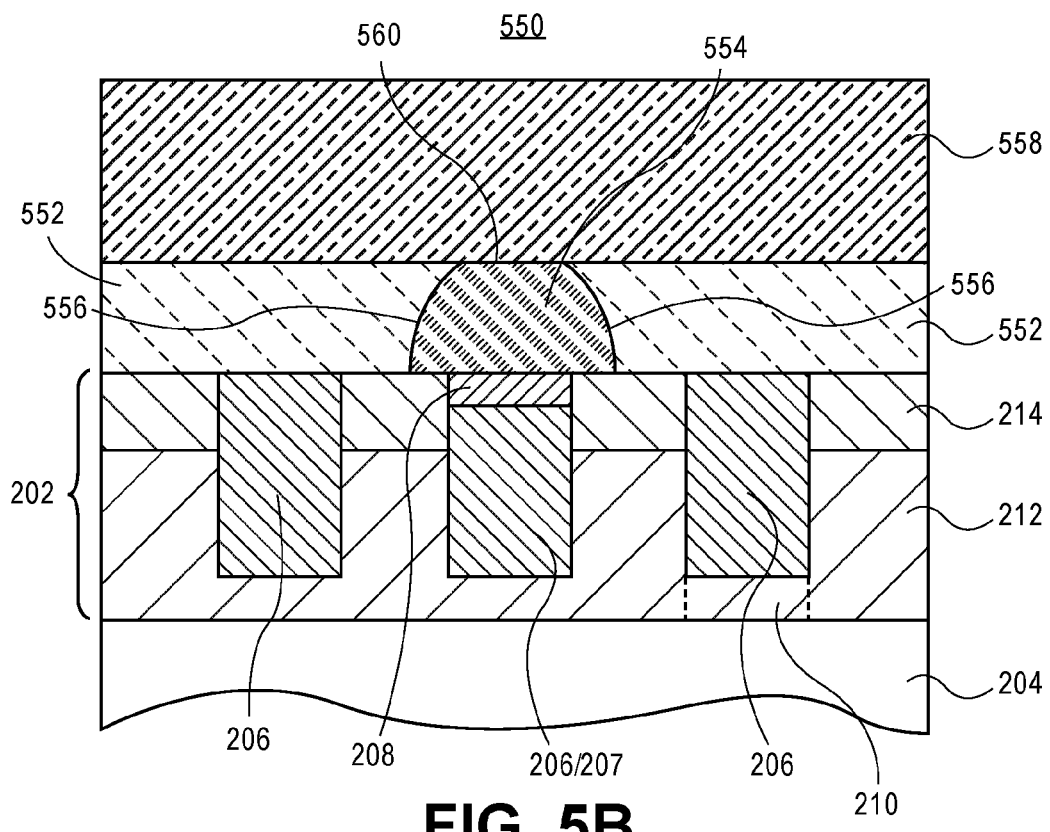
FIG. 5B illustrates a cross-sectional view of a portion of an integrated circuit layer including a self-aligned conductive via, in accordance with another embodiment of the present invention.

Referring to FIG. 5B, an integrated circuit structure 550 includes a substrate 204. A plurality of alternating first and second conductive lines 206 is along a first direction of a back end of line (BEOL) metallization layer 202 in a first inter-layer dielectric (ILD) layer 212 (and possibly 214) above the substrate 202. Although depicted as alternating differing lines, the lines could instead be lines of a same composition. A conductive via 554 is on and electrically coupled to one of the conductive lines 207 of the plurality of alternating first and second conductive lines 206. The conductive via 554 has a flat top surface 560 and outwardly tapered sidewalls 556. That is, the conductive via 554 essentially matches the geometry of the opening 340 described above. In one embodiment, the conductive via 554 is centered over the one of the conductive lines 207. A second ILD layer 552 is above the plurality of alternating first and second conductive lines 206 and laterally adjacent to the conductive via 554. In an embodiment, the second ILD layer 552 has an uppermost surface substantially co-planar with the flat top surface 560 of the conductive via 554, as is depicted in FIG. 5B. The flat top surface 560 may be formed during a planarization process, such as a chemical mechanical planarization (CMP) process, used to form the conductive via 554.

In an embodiment, the outwardly tapered sidewalls 556 of the conductive via 554 are outwardly curved, as is depicted in FIG. 5B. In an embodiment, the integrated circuit structure 550 further includes an upper conductive line 558 on the second ILD layer 552 and on and electrically connected to the conductive via 554. In one such embodiment, the upper conductive line 558 is along a second direction orthogonal to the first direction. In an embodiment, the upper conductive line 558 includes a barrier layer on the entire flat surface 560 of the conductive via 554.

In an embodiment, the second ILD layer 552 includes a plurality of trisilacyclohexanes cross-linked together by O groups. In an embodiment, the first conductive lines are spaced apart by a pitch, and the second conductive lines are spaced apart by the pitch. In an embodiment, a total composition of the first conductive lines is the same as a total composition of the second conductive lines. In another embodiment, a total composition of the first conductive lines is different from a total composition of the second conductive lines. In an embodiment, each of the first conductive lines includes a conductive cap layer 208, and each of the second conductive lines does not include a conductive cap layer. In one such embodiment, the one of the conductive lines 207 of the plurality of alternating first and second conductive lines 206 is a first conductive line, and the conductive via 554 is on the conductive cap layer 208 of the one of the conductive lines 207.

A resulting structure such as described in association with FIG. 5A or FIG. 5B may subsequently be used as a foundation for forming subsequent metal line/via and ILD layers. Alternatively, the structures of FIG. 5A or FIG. 5B may represent the final metal interconnect layer in an integrated circuit. It is to be appreciated that the above process operations may be practiced in alternative sequences, not every operation need be performed and/or additional process operations may be performed. Although the above methods (e.g., FIG. 1A-1D, 2A-2C, 3A-3B, or 4A-4D) of fabricating a metallization layer of a BEOL metallization layer have been described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, and/or any other associated action with microelectronic component fabrication.

In an embodiment, as used throughout the present description, an interlayer dielectric (ILD) material is composed of or includes a layer of a dielectric or insulating material. Examples of suitable dielectric materials include, but are not limited to, oxides of silicon (e.g., silicon dioxide ($SiO_2$)), nitrides of silicon (e.g., silicon nitride ($Si_3N_4$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a barrier layer and a conductive fill material. In one embodiment, the barrier layer is a tantalum or tantalum nitride layer, or a combination thereof. In one embodiment, the conductive fill material is a material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, metal lines, or simply interconnect.

In an embodiment, a conductive capping layer distinct from the above described barrier layer is included on upper surfaces of the metal lines. In one such embodiment, a metal capping layer such as a cobalt capping layer, is used. In another such embodiment, a metal nitride capping layer, such as a titanium nitride or tantalum nitride capping layer, is used. In yet another such embodiment, a conductive metal oxide capping layer, such as a ruthenium oxide or molybdenum oxide capping layer, is used.

In an embodiment, as is also used throughout the present description, hardmask materials (and in some instances etch stop layers) are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials, such as silicon carbide. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the art may be used depending upon the particular implementation. The hardmask layers may be formed by CVD, PVD, or by other deposition methods.

It is to be appreciated that the layers and materials described in association with FIGS. 1A-1D, 2A-2C, 3A-3B, 4A-4D, 5A and 5B are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIGS. 1A-1D, 2A-2C, 3A-3B, 4A-4D, 5A and 5B may be fabricated on underlying lower level interconnect layers.

As described above, patterned features may be patterned in a grating-like pattern with lines, holes or trenches spaced at a constant pitch and having a constant width. The pattern, for example, may be fabricated by a pitch halving or pitch quartering approach. In an example, a blanket film (such as a polycrystalline silicon film) is patterned using lithography and etch processing which may involve, e.g., spacer-based-quadruple-patterning (SBQP) or pitch quartering. It is to be appreciated that a grating pattern of lines can be fabricated by numerous methods, including 193 nm immersion litho (i193), EUV and/or EBDW lithography, directed self-assembly, etc. In other embodiments, the pitch does not need to be constant, nor does the width.

Figure 6A:
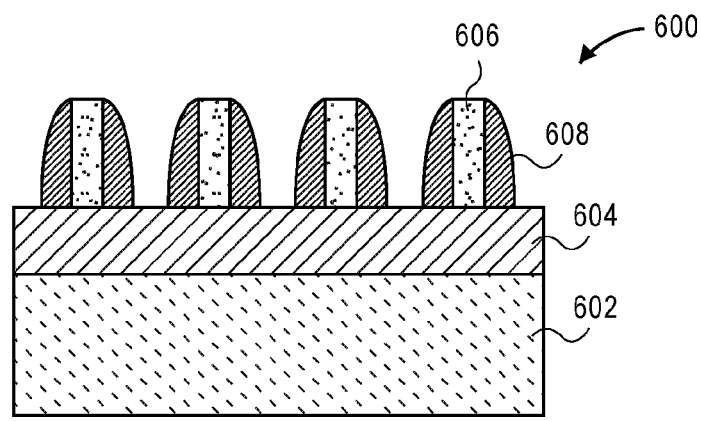
FIG. 6A illustrates a cross-sectional view of a starting structure following deposition, but prior to patterning, of a hardmask material layer formed on an interlayer dielectric (ILD) layer, in accordance with an embodiment of the present invention.
Figure 6B:
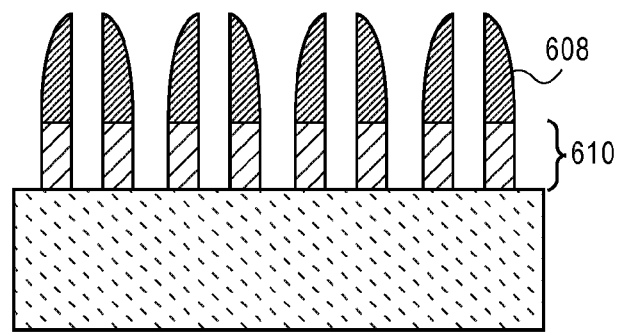
FIG. 6B illustrates a cross-sectional view of the structure of FIG. 6A following patterning of the hardmask layer by pitch halving, in accordance with an embodiment of the present invention.

In an embodiment, pitch division techniques are used to increase a line density. In a first example, pitch halving can be implemented to double the line density of a fabricated grating structure. FIG. 6A illustrates a cross-sectional view of a starting structure following deposition, but prior to patterning, of a hardmask material layer formed on an interlayer dielectric (ILD) layer. FIG. 6B illustrates a cross-sectional view of the structure of FIG. 6A following patterning of the hardmask layer by pitch halving.

Referring to FIG. 6A, a starting structure 600 has a hardmask material layer 604 formed on an interlayer dielectric (ILD) layer 602. A patterned mask 606 is disposed above the hardmask material layer 604. The patterned mask 606 has spacers 608 formed along sidewalls of features (lines) thereof, on the hardmask material layer 604.

Referring to FIG. 6B, the hardmask material layer 604 is patterned in a pitch halving approach. Specifically, the patterned mask 606 is first removed. The resulting pattern of the spacers 608 has double the density, or half the pitch or the features of the mask 606. The pattern of the spacers 608 is transferred, e.g., by an etch process, to the hardmask material layer 604 to form a patterned hardmask 610, as is depicted in FIG. 6B. In one such embodiment, the patterned hardmask 610 is formed with a grating pattern having unidirectional lines. The grating pattern of the patterned hardmask 610 may be a tight pitch grating structure. For example, the tight pitch may not be achievable directly through conventional lithography techniques. Even further, although not shown, the original pitch may be quartered by a second round of spacer mask patterning. Accordingly, the grating-like pattern of the patterned hardmask 610 of FIG. 6B may have hardmask lines spaced at a constant pitch and having a constant width relative to one another. The dimensions achieved may be far smaller than the critical dimension of the lithographic technique employed. Accordingly, a blanket film may be patterned using lithography and etch processing which may involve, e.g., spacer-based-double-patterning (SBDP) or pitch halving, or spacer-based-quadruple-patterning (SBQP) or pitch quartering.

Figure 7:
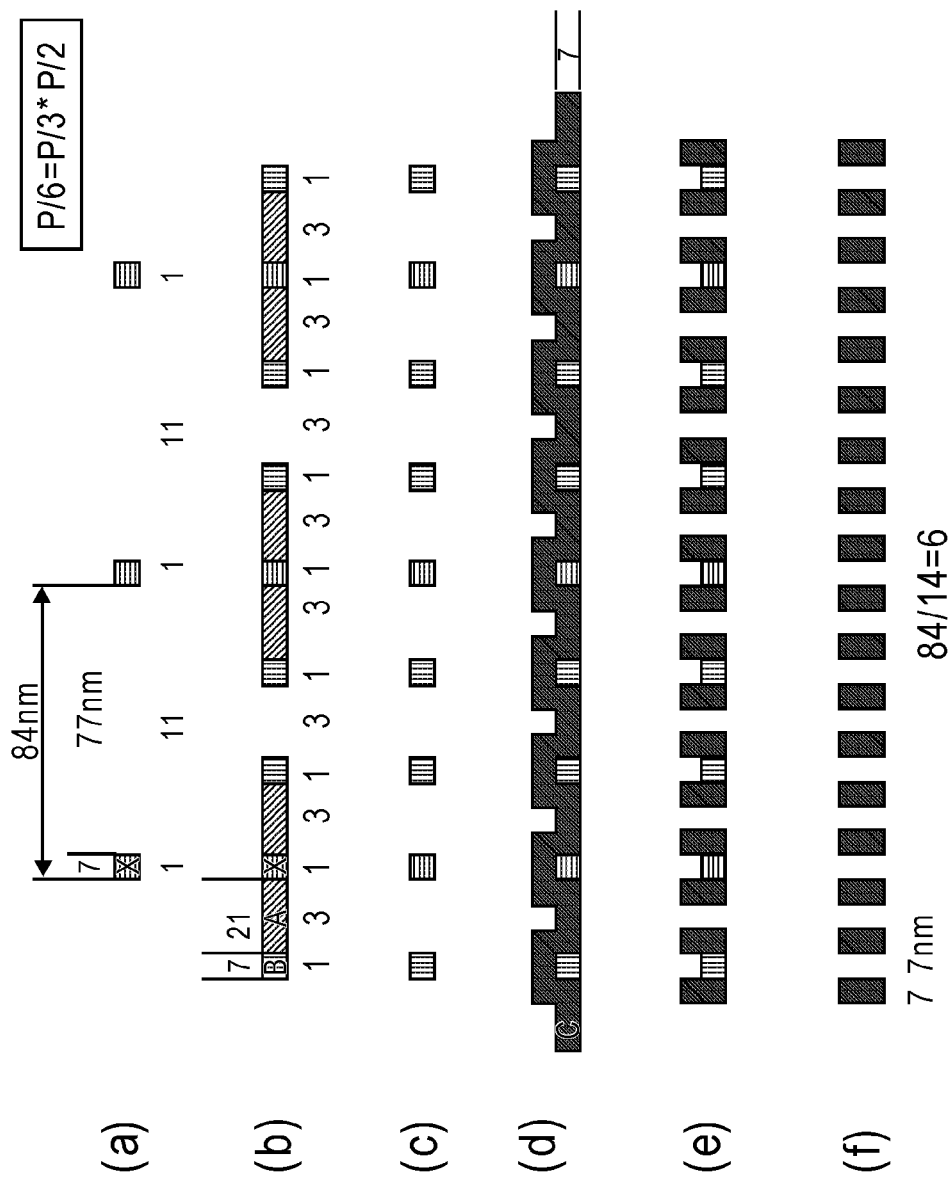
FIG. 7 illustrates cross-sectional views in a spacer-based-sextuple-patterning (SBSP) processing scheme which involves pitch division by a factor of six, in accordance with an embodiment of the present invention.

It is to be appreciated that other pitch division approaches may also be implemented. For example, FIG. 7 illustrates cross-sectional views in a spacer-based-sextuple-patterning (SBSP) processing scheme which involves pitch division by a factor of six. Referring to FIG. 7, at operation (a), a sacrificial pattern X is shown following litho, slim and etch processing. At operation (b), spacers A and B are shown following deposition and etching. At operation (c), the pattern of operation (b) is shown following spacer A removal. At operation (d), the pattern of operation (c) is shown following spacer C deposition. At operation (e), the pattern of operation (d) is shown following spacer C etch. At operation (f), a pitch/6 pattern is achieved following sacrificial pattern X removal and spacer B removal.

In an embodiment, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
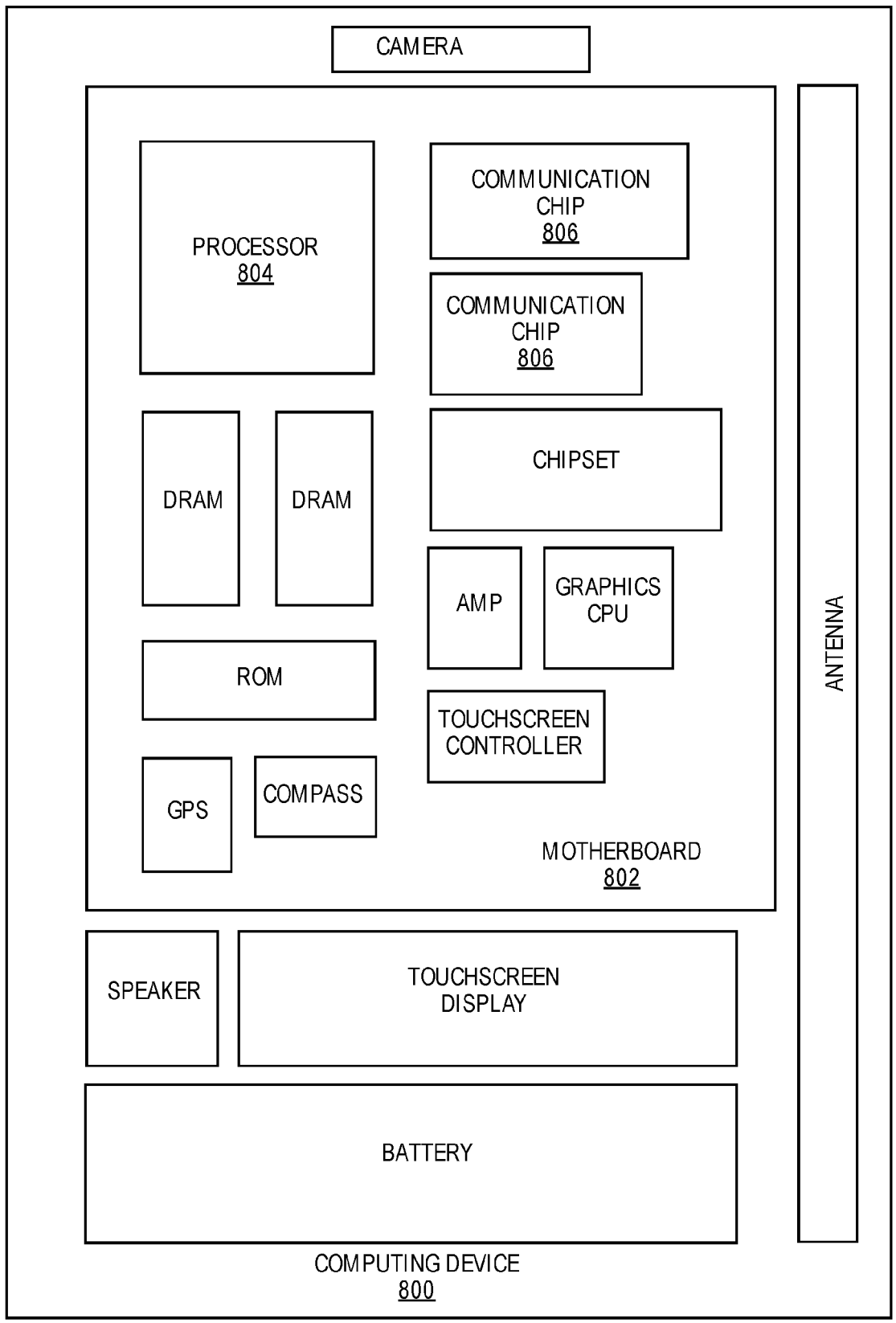
FIG. 8 illustrates a computing device in accordance with one implementation of an embodiment of the present invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more structures, such as BEOL metallization layers, built in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more structures, such as BEOL metallization layers, built in accordance with implementations of the invention.

In further implementations, another component housed within the computing device 800 may contain an integrated circuit die that includes one or more structures, such as BEOL metallization layers, built in accordance with implementations of the invention.

In various implementations, the computing device 800 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
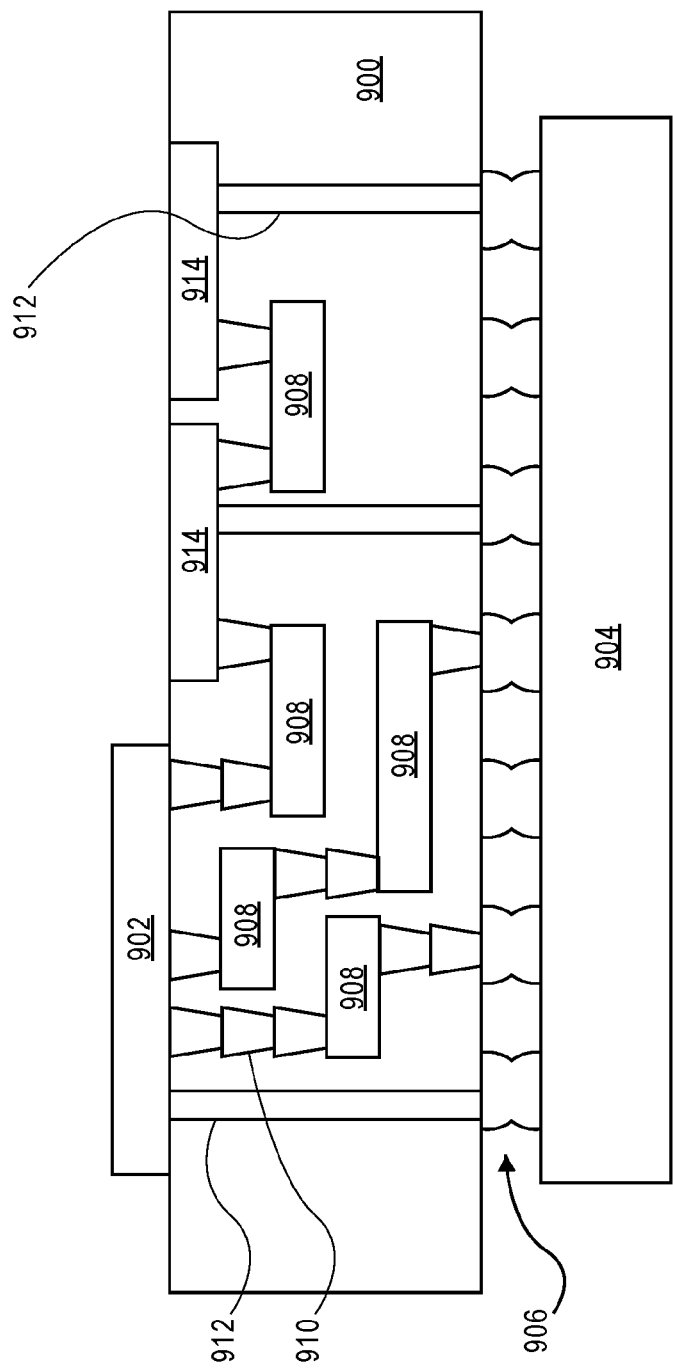
FIG. 9 is an interposer implementing one or more embodiments of the invention.

FIG. 9 illustrates an interposer 900 that includes one or more embodiments of the invention. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the invention, apparatuses or processes disclosed herein may be used in the fabrication of interposer 900.

Thus, embodiments of the present invention include surface-aligned lithographic patterning approaches for back end of line (BEOL) interconnect fabrication, and the resulting structures.

Example Embodiment 1

An integrated circuit structure includes a substrate. A plurality of alternating first and second conductive lines is along a first direction of a back end of line (BEOL) metallization layer in a first inter-layer dielectric (ILD) layer above the substrate. A conductive via is on and electrically coupled to one of the conductive lines of the plurality of alternating first and second conductive lines, the conductive via having a flat top surface and reentrant sidewalls, and the conductive via centered over the one of the conductive lines. A second ILD layer is above the plurality of alternating first and second conductive lines and laterally adjacent to the conductive via. The second ILD layer has an uppermost surface substantially co-planar with the flat top surface of the conductive via.

Example Embodiment 2

The integrated circuit structure of example embodiment 1, wherein the reentrant sidewalls of the conductive via are inwardly curved.

Example Embodiment 3

The integrated circuit structure of example embodiment 1 or 2, further including an upper conductive line on the second ILD layer and on and electrically connected to the conductive via, the upper conductive line along a second direction orthogonal to the first direction.

Example Embodiment 4

The integrated circuit structure of example embodiment 3, wherein the upper conductive line includes a barrier layer on the entire flat surface of the conductive via.

Example Embodiment 5

The integrated circuit structure of example embodiment 1, 2, 3 or 4, wherein the second ILD layer includes a plurality of trisilacyclohexanes cross-linked together by O groups.

Example Embodiment 6

The integrated circuit structure of example embodiment 1, 2, 3, 4 or 5, wherein the first conductive lines are spaced apart by a pitch, and wherein the second conductive lines are spaced apart by the pitch.

Example Embodiment 7

The integrated circuit structure of example embodiment 1, 2, 3, 4, 5 or 6, wherein a total composition of the first conductive lines is the same as a total composition of the second conductive lines.

Example Embodiment 8

The integrated circuit structure of example embodiment 1, 2, 3, 4, 5 or 6, wherein a total composition of the first conductive lines is different from a total composition of the second conductive lines.

Example Embodiment 9

The integrated circuit structure of example embodiment 1, 2, 3, 4, 5, 6 or 8, wherein each of the first conductive lines includes a conductive cap layer, wherein each of the second conductive lines does not include a conductive cap layer, wherein the one of the conductive lines of the plurality of alternating first and second conductive lines is a first conductive line, and wherein the conductive via is on the conductive cap layer of the one of the conductive lines.

Example Embodiment 10

An integrated circuit structure includes a substrate. A plurality of alternating first and second conductive lines is along a first direction of a back end of line (BEOL) metallization layer in a first inter-layer dielectric (ILD) layer above the substrate. A conductive via is on and electrically coupled to one of the conductive lines of the plurality of alternating first and second conductive lines, the conductive via having a flat top surface and outwardly tapered sidewalls, and the conductive via centered over the one of the conductive lines. A second ILD layer is above the plurality of alternating first and second conductive lines and laterally adjacent to the conductive via. The second ILD layer has an uppermost surface substantially co-planar with the flat top surface of the conductive via.

Example Embodiment 11

The integrated circuit structure of example embodiment 10, wherein the outwardly tapered sidewalls of the conductive via are outwardly curved.

Example Embodiment 12

The integrated circuit structure of example embodiment 10 or 11, further including an upper conductive line on the second ILD layer and on and electrically connected to the conductive via, the upper conductive line along a second direction orthogonal to the first direction.

Example Embodiment 13

The integrated circuit structure of example embodiment 12, wherein the upper conductive line includes a barrier layer on the entire flat surface of the conductive via.

Example Embodiment 14

The integrated circuit structure of example embodiment 10, 11, 12 or 13, wherein the second ILD layer includes a plurality of trisilacyclohexanes cross-linked together by O groups.

Example Embodiment 15

The integrated circuit structure of example embodiment 10, 11, 12, 13 or 14, wherein the first conductive lines are spaced apart by a pitch, and wherein the second conductive lines are spaced apart by the pitch.

Example Embodiment 16

The integrated circuit structure of example embodiment 10, 11, 12, 13, 14 or 15, wherein a total composition of the first conductive lines is the same as a total composition of the second conductive lines.

Example Embodiment 17

The integrated circuit structure of example embodiment 10, 11, 12, 13, 14 or 15, wherein a total composition of the first conductive lines is different from a total composition of the second conductive lines.

Example Embodiment 18

The integrated circuit structure of example embodiment 10, 11, 12, 13, 14, 15 or 17, wherein each of the first conductive lines includes a conductive cap layer, wherein each of the second conductive lines does not include a conductive cap layer, wherein the one of the conductive lines of the plurality of alternating first and second conductive lines is a first conductive line, and wherein the conductive via is on the conductive cap layer of the one of the conductive lines.

Example Embodiment 19

A method of fabricating a back end of line (BEOL) metallization layer includes forming a plurality of conductive lines along a first direction of a back end of line (BEOL) metallization layer in a first inter-layer dielectric (ILD) layer above a substrate. A surface quencher layer is formed on upper surfaces of the ILD layer between adjacent ones of the plurality of conductive lines. A resist layer is formed on the plurality of conductive lines and on the surface quencher layer on upper surfaces of the ILD layer. A lithographic exposure of a portion of the resist layer above one of the plurality of conductive lines is performed, where the surface quencher layer creates a sensitivity modulated region in the resist layer adjacent to the portion of the resist layer. The resist layer is developed to remove portions of the resist layer not exposed to the lithographic exposure, to remove the sensitivity modulated region, and to retain the portion of the resist layer. A conductive via is formed in place of the portion of the resist layer, the conductive via on and electrically coupled to the one of the plurality of conductive lines.

Example Embodiment 20

The method of example embodiment 19, wherein forming the conductive via in place of the portion of the resist layer includes forming a second ILD layer above the plurality of conductive lines and laterally adjacent to the portion of the resist layer, removing the portion of the resist layer to form an opening, and forming the conductive via in the opening.

Example Embodiment 21

The method of example embodiment 20, wherein forming the second ILD layer includes forming a layer including a plurality of trisilacyclohexanes cross-linked together by O groups.

Example Embodiment 22

The method of example embodiment 19, 20 or 21, wherein forming the plurality of conductive lines includes using a pitch division patterning process.

Example Embodiment 23

A method of fabricating a back end of line (BEOL) metallization layer includes forming a plurality of conductive lines along a first direction of a back end of line (BEOL) metallization layer in a first inter-layer dielectric (ILD) layer above a substrate. A surface quencher layer is formed on an upper surface of one of the plurality of conductive lines. A resist layer is formed on the plurality of conductive lines and on the surface quencher layer. A lithographic exposure of portions of the resist layer adjacent to the one of the plurality of conductive lines is performed, where the surface quencher layer creates a sensitivity modulated region in the resist layer above the one of the plurality of conductive lines. The resist layer is developed to remove portions of the resist layer not exposed to the lithographic exposure, to remove the sensitivity modulated region, and to retain the portions of the resist layer. A conductive via is formed on and electrically coupled to the one of the plurality of conductive lines.

Example Embodiment 24

The method of example embodiment 23, further including replacing the portions of the resist layer with a second ILD layer, the second ILD layer including a plurality of trisilacyclohexanes cross-linked together by O groups.

Example Embodiment 25

The method of example embodiment 23 or 24, wherein forming the plurality of conductive lines includes using a pitch division patterning process.

What is claimed is:

1. An integrated circuit structure, comprising:
a substrate;
a plurality of alternating first and second conductive lines along a first direction of a back end of line (BEOL) metallization layer in a first inter-layer dielectric (ILD) layer above the substrate;
a conductive via on and electrically coupled to one of the conductive lines of the plurality of alternating first and second conductive lines, the conductive via having a flat top surface and reentrant sidewalls, and the conductive via centered over the one of the conductive lines; and
a second ILD layer above the plurality of alternating first and second conductive lines and laterally adjacent to the conductive via, the second ILD layer having an uppermost surface substantially co-planar with the flat top surface of the conductive via.

2. The integrated circuit structure of claim 1, wherein the reentrant sidewalls of the conductive via are inwardly curved.

3. The integrated circuit structure of claim 1, further comprising:
an upper conductive line on the second ILD layer and on and electrically connected to the conductive via, the upper conductive line along a second direction orthogonal to the first direction.

4. The integrated circuit structure of claim 3, wherein the upper conductive line comprises a barrier layer on the entire flat surface of the conductive via.

5. The integrated circuit structure of claim 1, wherein the second ILD layer comprises a plurality of trisilacyclohexanes cross-linked together by O groups.

6. The integrated circuit structure of claim 1, wherein the first conductive lines are spaced apart by a pitch, and wherein the second conductive lines are spaced apart by the pitch.

7. The integrated circuit structure of claim 1, wherein a total composition of the first conductive lines is the same as a total composition of the second conductive lines.

8. The integrated circuit structure of claim 1, wherein a total composition of the first conductive lines is different from a total composition of the second conductive lines.

9. The integrated circuit structure of claim 8, wherein each of the first conductive lines includes a conductive cap layer, wherein each of the second conductive lines does not include a conductive cap layer, wherein the one of the conductive lines of the plurality of alternating first and second conductive lines is a first conductive line, and wherein the conductive via is on the conductive cap layer of the one of the conductive lines.

10. An integrated circuit structure, comprising:
a substrate;
a plurality of alternating first and second conductive lines along a first direction of a back end of line (BEOL) metallization layer in a first inter-layer dielectric (ILD) layer above the substrate;
a conductive via on and electrically coupled to one of the conductive lines of the plurality of alternating first and second conductive lines, the conductive via having a flat top surface and outwardly tapered sidewalls, and the conductive via centered over the one of the conductive lines; and
a second ILD layer above the plurality of alternating first and second conductive lines and laterally adjacent to the conductive via, the second ILD layer having an uppermost surface substantially co-planar with the flat top surface of the conductive via.

11. The integrated circuit structure of claim 10, wherein the outwardly tapered sidewalls of the conductive via are outwardly curved.

12. The integrated circuit structure of claim 10, further comprising:
an upper conductive line on the second ILD layer and on and electrically connected to the conductive via, the upper conductive line along a second direction orthogonal to the first direction.

13. The integrated circuit structure of claim 12, wherein the upper conductive line comprises a barrier layer on the entire flat surface of the conductive via.

14. The integrated circuit structure of claim 10, wherein the second ILD layer comprises a plurality of trisilacyclohexanes cross-linked together by O groups.

15. The integrated circuit structure of claim 10, wherein the first conductive lines are spaced apart by a pitch, and wherein the second conductive lines are spaced apart by the pitch.

16. The integrated circuit structure of claim 10, wherein a total composition of the first conductive lines is the same as a total composition of the second conductive lines.

17. The integrated circuit structure of claim 10, wherein a total composition of the first conductive lines is different from a total composition of the second conductive lines.

18. The integrated circuit structure of claim 17, wherein each of the first conductive lines includes a conductive cap layer, wherein each of the second conductive lines does not include a conductive cap layer, wherein the one of the conductive lines of the plurality of alternating first and second conductive lines is a first conductive line, and wherein the conductive via is on the conductive cap layer of the one of the conductive lines.

19. A method of fabricating a back end of line (BEOL) metallization layer, the method comprising:
forming a plurality of conductive lines along a first direction of a back end of line (BEOL) metallization layer in a first inter-layer dielectric (ILD) layer above a substrate;
forming a surface quencher layer on upper surfaces of the ILD layer between adjacent ones of the plurality of conductive lines;
forming a resist layer on the plurality of conductive lines and on the surface quencher layer on upper surfaces of the ILD layer;
performing a lithographic exposure of a portion of the resist layer above one of the plurality of conductive lines, wherein the surface quencher layer creates a sensitivity modulated region in the resist layer adjacent to the portion of the resist layer;
developing the resist layer to remove portions of the resist layer not exposed to the lithographic exposure, to remove the sensitivity modulated region, and to retain the portion of the resist layer; and
forming a conductive via in place of the portion of the resist layer, the conductive via on and electrically coupled to the one of the plurality of conductive lines.

20. The method of claim 19, wherein forming the conductive via in place of the portion of the resist layer comprises:
forming a second ILD layer above the plurality of conductive lines and laterally adjacent to the portion of the resist layer;
removing the portion of the resist layer to form an opening; and
forming the conductive via in the opening.

21. The method of claim 20, wherein forming the second ILD layer comprises forming a layer including a plurality of trisilacyclohexanes cross-linked together by O groups.

22. The method of claim 19, wherein forming the plurality of conductive lines comprises using a pitch division patterning process.

23. A method of fabricating a back end of line (BEOL) metallization layer, the method comprising:
forming a plurality of conductive lines along a first direction of a back end of line (BEOL) metallization layer in a first inter-layer dielectric (ILD) layer above a substrate;
forming a surface quencher layer on an upper surface of one of the plurality of conductive lines;
forming a resist layer on the plurality of conductive lines and on the surface quencher layer;
performing a lithographic exposure of portions of the resist layer adjacent to the one of the plurality of conductive lines, wherein the surface quencher layer creates a sensitivity modulated region in the resist layer above the one of the plurality of conductive lines;
developing the resist layer to remove portions of the resist layer not exposed to the lithographic exposure, to remove the sensitivity modulated region, and to retain the portions of the resist layer; and
forming a conductive via on and electrically coupled to the one of the plurality of conductive lines.

24. The method of claim 23, further comprising:
replacing the portions of the resist layer with a second ILD layer, the second ILD layer including a plurality of trisilacyclohexanes cross-linked together by O groups.

25. The method of claim 23, wherein forming the plurality of conductive lines comprises using a pitch division patterning process.

* * * * *